(12) United States Patent
Yonekawa et al.

(10) Patent No.: US 10,889,052 B2
(45) Date of Patent: Jan. 12, 2021

(54) IMPRINT APPARATUS, METHOD FOR MANUFACTURING ARTICLE, AND EXPOSURE APPARATUS

(71) Applicant: CANON KABUSHIKI KAISHA, Tokyo (JP)

(72) Inventors: Masami Yonekawa, Utsunomiya (JP); Yoichi Matsuoka, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 707 days.

(21) Appl. No.: 15/436,635

(22) Filed: Feb. 17, 2017

(65) Prior Publication Data
US 2017/0246792 A1     Aug. 31, 2017

(30) Foreign Application Priority Data
Feb. 29, 2016   (JP) ................................. 2016-038129

(51) Int. Cl.
| | | |
|---|---|---|
| *B29C 59/00* | (2006.01) | |
| *B29C 59/02* | (2006.01) | |
| *H01L 21/027* | (2006.01) | |
| *G03F 7/00* | (2006.01) | |
| *B29L 31/34* | (2006.01) | |

(52) U.S. Cl.
CPC .......... *B29C 59/002* (2013.01); *B29C 59/022* (2013.01); *B29C 59/026* (2013.01); *G03F 7/0002* (2013.01); *H01L 21/0271* (2013.01); *B29L 2031/3406* (2013.01)

(58) Field of Classification Search
CPC ... B29C 59/002; B29C 59/026; B29C 59/022; H01L 21/0271; G03F 7/0002; B29L 2031/3406
See application file for complete search history.

(56) References Cited

FOREIGN PATENT DOCUMENTS

| | | |
|---|---|---|
| JP | 2002-124463 A | 4/2002 |
| JP | 2006-120776 A | 5/2006 |
| JP | 2012-174809 A | 9/2012 |
| JP | 2014-175340 A | 9/2014 |
| JP | 5818962 B2 | 11/2015 |

OTHER PUBLICATIONS

English translation of JP2014-175340 (Application No. JP 2013-044121) (publication date Sep. 22, 2014) (Year: 2014).*

\* cited by examiner

*Primary Examiner* — Robert J Grun
(74) *Attorney, Agent, or Firm* — Canon U.S.A., Inc. IP Division

(57) ABSTRACT

There is provided an imprint apparatus for forming a pattern of an imprint material on a substrate by using a mold, the imprint apparatus including a mold holding unit configured to hold the mold, and a substrate holding unit configured to hold the substrate, in which a particle is captured by generating a first region and a second region charged to different polarities in at least either one of a peripheral region of a region covered by the mold of the mold holding unit and a peripheral region of a region covered by the substrate of the substrate holding unit.

11 Claims, 13 Drawing Sheets

A-A' SECTION

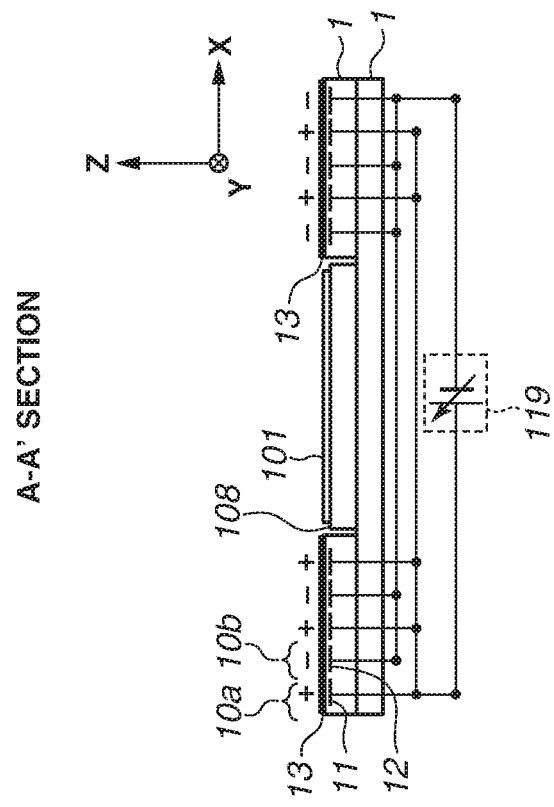
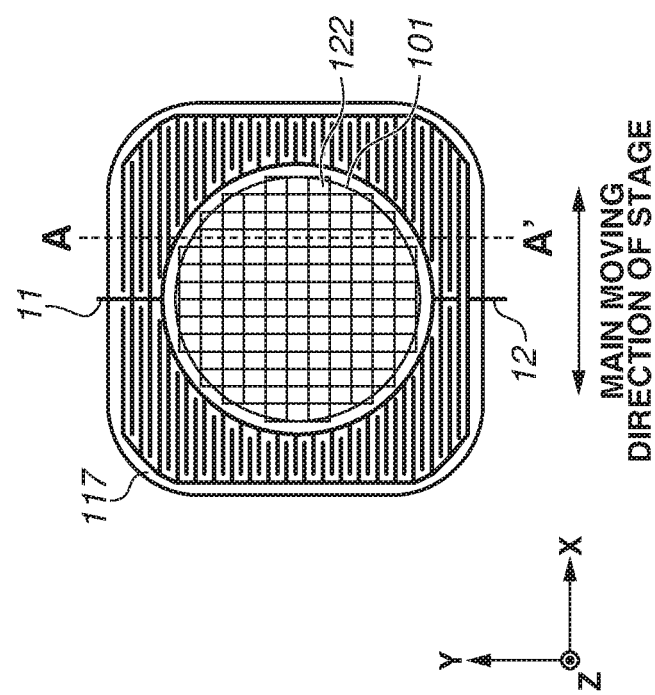

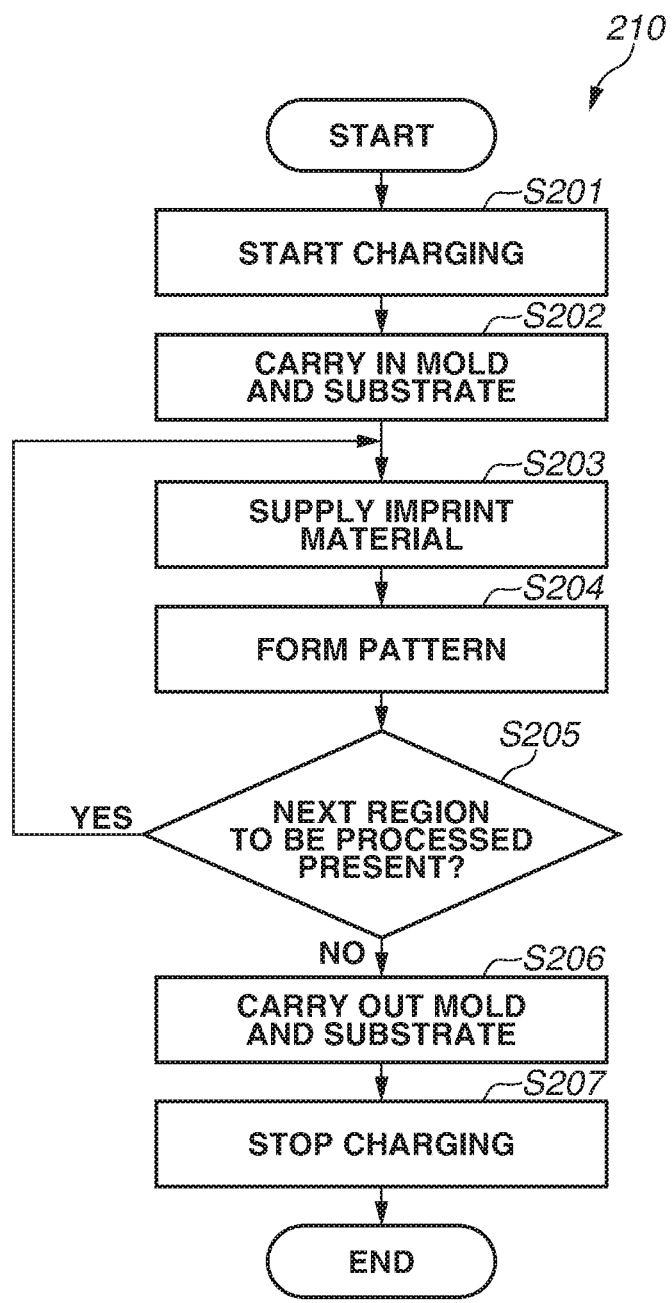

IMPRINT APPARATUS, METHOD FOR MANUFACTURING ARTICLE, AND EXPOSURE APPARATUS

BACKGROUND OF THE INVENTION

Field of the Invention

Aspects of the present invention generally relate to an imprint apparatus, a method for manufacturing an article, and an exposure apparatus.

Description of the Related Art

An imprint apparatus is known as an apparatus for forming a fine pattern to manufacture a semiconductor device. The imprint apparatus is an apparatus for forming a cured material pattern on which a mold concavo-convex pattern is transferred. To form a cured material pattern, the imprint apparatus, in a state where an imprint material supplied to a region to be processed on a substrate is in contact with a mold, applies energy for curing to the imprint material.

If the mold is charged when the mold and the imprint material are separated, charged particles floating are likely to adhere to the mold. In addition, peripheral particles may fall on the substrate. Pinching particles between the substrate and the mold when bringing the imprint material and the mold into contact with each other may possibly cause faults on the cured material pattern to be formed.

Japanese Patent Application Laid-Open No. 2014-175340 discusses a technique for capturing peripheral particles by using a mold having a charged convex portion on the surface on the side of pattern formation.

SUMMARY OF THE INVENTION

According to an aspect of the present invention, an imprint apparatus for forming a pattern of an imprint material on a substrate by using a mold includes a mold holding unit configured to hold the mold, and a substrate holding unit configured to hold the substrate. A particle is captured by generating a first region and a second region charged to different polarities in at least either one of a peripheral region of a region covered by the mold of the mold holding unit and a peripheral region of a region covered by the substrate of the substrate holding unit.

Further features of aspects of the present invention will become apparent from the following description of exemplary embodiments with reference to the attached drawings.

BRIEF DESCRIPTION OF THE DRAWINGS

FIGS. 2A and 2B illustrate a configuration of an electrode group.

FIG. 6 is a flowchart illustrating an imprinting method.

DESCRIPTION OF THE EMBODIMENTS (Configuration of Imprint Apparatus)

Figure 1:
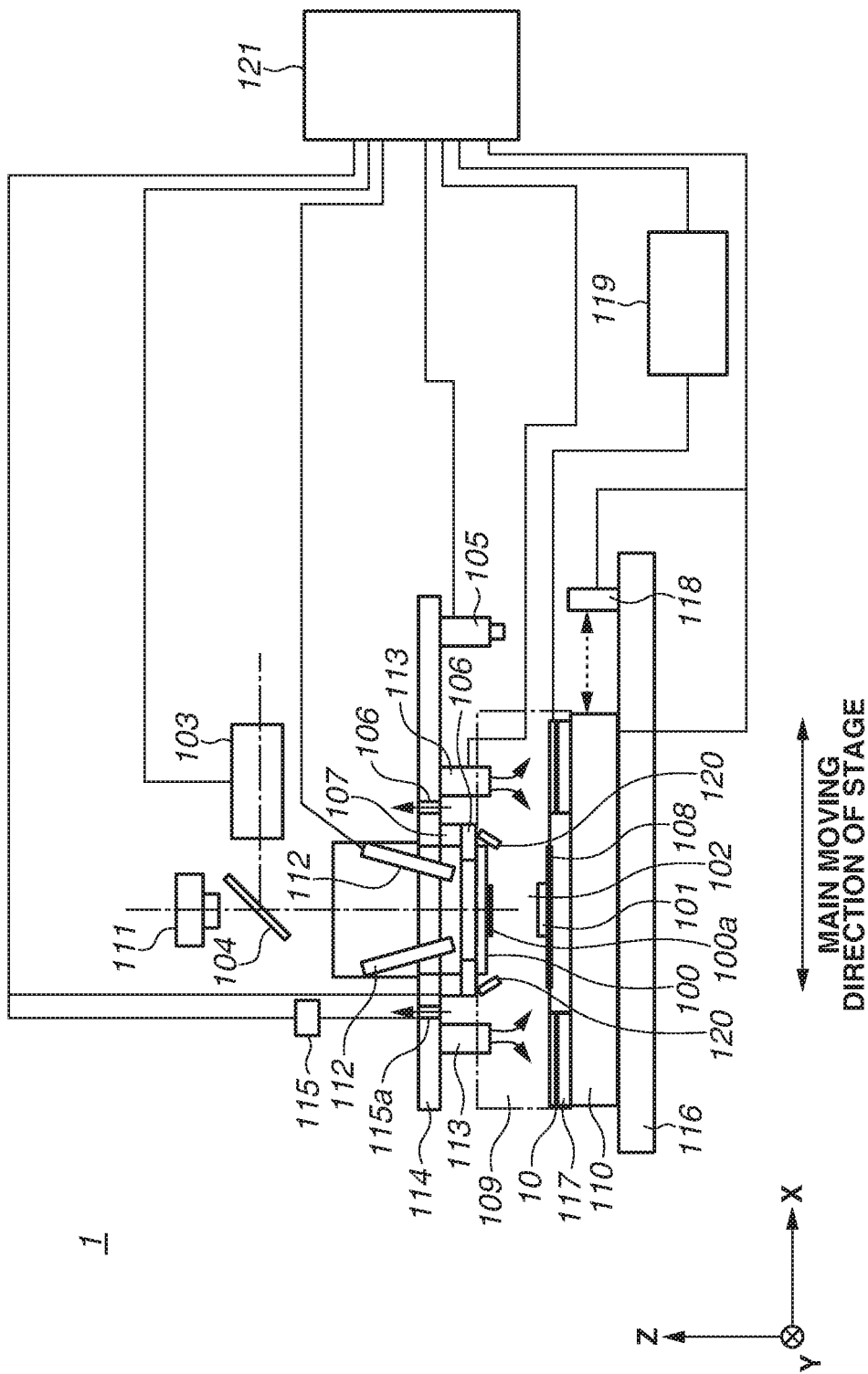
FIG. 1 illustrates a configuration of an imprint apparatus according to a first exemplary embodiment.

FIG. 1 illustrates a configuration of an imprint apparatus 1 according to a first exemplary embodiment. The Z axis extends in the perpendicular direction. The X and Y axes perpendicularly intersect with each other on a plane perpendicular to the Z axis. The imprint apparatus 1 forms a pattern through contact and separation between an imprint material 102 on a substrate 101 and a mold 100. The mold 100 has a pattern surface 100a with a three-dimensional pattern formed thereon.

An irradiation unit 103 emits ultraviolet rays to irradiate the imprint material 102 while the mold 100 is in contact with the imprint material 102 to cure the imprint material 102. A mirror 104 reflects toward the direction of the mold 100 the ultraviolet rays emitted from the irradiation unit 103. A supply unit 105 supplies the imprint material 102 in an uncured state onto the substrate 101.

The imprint apparatus 1 has a chuck 106 and a stage 107 as mold holding units for holding the mold 100. The chuck 106 is disposed on the stage 107 to hold the surface on the opposite side of the pattern surface 100a of the mold 100 through a vacuum suction force, an electrostatic force, or a mechanical unit.

The stage 107 moves the mold 100 together with the chuck 106 mainly along the Z-axis direction. The stage 107 performs an operation for bringing the mold 100 and the imprint material 102 into contact with each other (hereinafter referred to as a mold pressing operation) and an operation for releasing the mold 100 and the imprint material 102 (hereinafter referred to as a mold releasing operation). The stage 107 may move the mold 100 in the X-Y plane at the time of positioning between the substrate 101 and the mold 100. Example actuators employable as a drive mechanism (not illustrated) for the stage 107 include a voice coil motor and an air cylinder. The chuck 106 and the stage 107 may be integrally formed as one member.

The imprint apparatus 1 includes a chuck 108 serving as a substrate holding unit for holding the substrate 101 by attracting the substrate 101, and a stage 110 which moves together with the chuck 108 and the substrate 101. The substrate holding unit is also a moving member for moving the substrate 101.

The chuck 108 holds the substrate 101 through a vacuum suction force, an electrostatic force, or a mechanical unit.

The stage 110 mounting the chuck 108 and the substrate 101 mainly moves in the X-Y plane. FIG. 1 illustrates a state where the stage 110 is stopped at a position where the substrate 101 faces the mold 100 (hereinafter referred to as an imprint position). The stage 110 may move the substrate 101 in the Z-axis direction at the time of the mold pressing operation or mold releasing operation. Example actuators employable as a drive mechanism (not illustrated) for the stage 107 include a voice coil motor and an air cylinder.

For each of a plurality of regions to be processed 122 on the substrate 101 (illustrated in FIGS. 2A and 2B), the imprint apparatus 1 repetitively supplies the imprint material 102 and performs pattern formation on the supplied imprint material 102. Therefore, the main moving direction of the stage 110 according to the present exemplary embodiment is the direction directed from the position facing the supply unit 105 toward the position facing the mold 100. In the present exemplary embodiment, the main moving direction of the stage 110 is X-axis direction.

The stage 107 and the stage 110 may be configured by a fine motion stage and a coarse motion stage which provides a larger amount of stroke than the fine motion stage. This configuration enables positioning the mold 100 or the substrate 101 with favorable accuracy.

An observation unit 111 emits to the substrate 101 light having a wavelength which penetrates the mirror 104, and receives light reflected by the substrate 101. With this process, the observation unit 111 observes the state of filling a concavo-convex structure of a pattern surface 100a with the imprint material 102. The mold 100 and the substrate 101 are provided with marks (not illustrated) which indicate positions of at least the four corners of the pattern surface 100a and at least the four corners of the region to be processed 122. Measurement units 112 detect the above-described marks formed on the mold 100 and the above-described marks formed on the substrate 101, and measures the relative position between the pattern surface 100a and the region to be processed 122 on the substrate 101.

Gas blow-off units 113 each having an annular opening are disposed around the stage 107 and the chuck 106 to supply a gas from the opening in the Z-axis direction. This reduces the possibility that particles generated within the imprint apparatus 1 enter an imprint space. The imprint space refers to a space defined by the region inside the gas blow-off units 113 and the moving height of the stage 110. The imprint space includes at least the space between the mold 100 and the stage 110 (the space below the mold 100) when the stage 110 is stopped at the imprint position.

A base 114 hangs and supports the gas blow-off units 113, the supply unit 105, and the stage 107. An exhaust unit 115 is connected with an exhaust port 115a to discharge the gas supplied from the gas blow-off units 113. The stage 110 and an interferometer 118 are mounted on a structure 116. The interferometer 118 irradiates a mirror (not illustrated) disposed at the lateral side of the stage 110 with laser light and measures the position of the stage 110 by using reflected laser light from the mirror.

A plate member 117 is disposed on the stage 110 and at the peripheral portion of the chuck 108 (the portion at which the mold holding unit holds the substrate 101). It is desirable that the plate member 117 surrounds the outer circumference of the region of the chuck 108 covered by the substrate 101 in the direction along the surface of the substrate 101 (in the direction along the holding surface for holding the substrate 101) as in the present exemplary embodiment. However, the plate member 117 may not surround part of the outer circumference of the chuck 108.

Although the plate member 117 according to the present exemplary embodiment is adjacently disposed to the chuck 108 in the X-axis direction, the plate members 117 may be in parallel disposed on the outer circumferential side of the chuck 108 via other members. The plate member 117 has a polyimide film 13 (described below) and an electrode group 10 (described below).

A voltage source 119 applies a voltage to the electrode group 10. The voltage source 119 is able to apply a potential with a different polarity to each electrode constituting the electrode group 10. The voltage source 119 applies a predetermined direct-current (DC) voltage among voltages having an absolute value of about 300V to 3 kV, for example, to the electrode group 10.

Gas supply units 120 supply a gas different from the ambient gas. The gas supply units 120 supply a gas at least while the stage 110 moves the substrate 101 to the imprint position. For example, when the ambient gas before the gas supply units 120 supply a gas is air, the gas supply units 120 supply at least one of helium, nitrogen, and a condensable gas.

The plate member 117 also serves as a baffle plate for guiding to the space between the mold 100 and the substrate 101 the air supplied from the gas supply units 120 while the stage 110 is moving to the imprint position. Replacing air with the gas supplied by the gas supply units 120 enables promoting to fill the concavo-convex surface formed on the pattern surface 100a with the imprint material 102, and preventing defects of a cured pattern.

A control unit 121 is wirelessly or by wire connected with the irradiation unit 103, the stage 110, the observation unit 111, the measurement units 112, the gas blow-off units 113, the interferometer 118, the voltage source 119, and the exhaust unit 115.

The control unit 121 includes a central processing unit (CPU) and memories (a read only memory (ROM) and a random access memory (RAM)) (not illustrated). The memories store a program about the imprint process (described below) in the flowchart illustrated in FIG. 6. The control unit 121 totally controls component members connected to the control unit 121 according to programs stored in the memories.

As long as the control unit 121 is provided with functions which should be performed by the control unit 121, the control unit 121 may be a set of separate control substrates or one control substrate.

(Configuration of Electrode Group)

FIGS. 2A and 2B illustrate a configuration of the electrode group 10. As illustrated in FIG. 2A, the plate member 117 has a plurality of electrodes as electrodes configuring the electrode group 10. The plurality of electrodes includes at least an electrode (first electrode) 11 disposed at the position corresponding to a region (first region) 10a of the plate member 117, and an electrode (second electrode) 12 disposed at the position corresponding to a region (second region) 10b of the plate member 117. The comb teeth-shaped electrodes 11 and 12 are disposed so as to be alternately arranged in the Y-axis direction. Almost all of the electrodes 11 and 12 (a half or more of the total length of the electrodes) extend along the main moving direction of the stage 110 (X-axis direction).

The regions 10a and 10b are regions existing on the surface that can face a space 109 (illustrated in FIG. 1) in which pattern formation is performed out of the surfaces of the plate member 117. In the present exemplary embodiment, the space 19 in which pattern formation is performed refers to the space on the side of the mold 100 of the mold holding unit and on the side of the substrate 101 of the substrate holding unit in a state where the mold 100 and the substrate 101 face each other. More specifically, the space 19 refers to the space on the −Z direction side of the stage 107 and on the +Z direction side of the stage 110.

FIG. 2B is cross-sectional view illustrating the electrodes 11 and 12 taken along the line A-A' illustrated in FIG. 2A. The voltage source 119 applies a voltage to the electrodes 11 and 12. In particular, the voltage source 119 applies a potential to the electrode 11 to charge the region 10a, and applies to the electrode 12 a potential with a different polarity from the electrode 11 to charge the region 10b. For example, FIG. 2B illustrates a state where the electrode 11 has a negative potential with respect to the ground potential (0V) and the electrode 12 has a positive potential with respect to the ground potential. The electrodes 11 and 12 are conductors made of a copper foil.

The surfaces of the electrodes 11 and 12 are covered by the polyimide film 13. The film 13 enables preventing the degradation due to surface oxidization and preventing electric discharge at the time of high-voltage application. The film 13 may be a dielectric material other than polyimide. Instead of collectively covering the electrodes 11 and 12 using the film 13, the electrodes 11 and 12 may be separately covered by a dielectric material.

Figure 3:
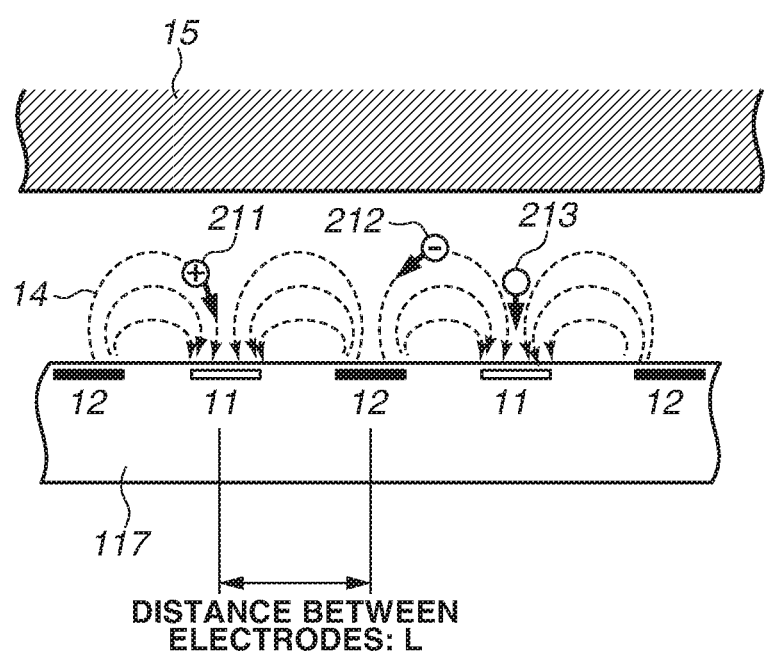
FIG. 3 illustrates an effect of capturing particles.

FIG. 3 illustrates an effect of capturing particles by the plate member 117. When the voltage source 119 negatively charges the electrode 11 and positively charges the electrode 12, an electric field is formed in the direction in which lines of electric force 14 are directed from the electrode 12 toward the electrode 11. When the voltage source 119 applies a voltage so that a positively charged region and a negatively charged region are alternately arranged, a closed electric field is formed so that the lines of electric force 14 extending from the plate member 117 advance toward the plate member 117.

A particle 211 positively charged in the vicinity of the electrodes 11 and 12 is subjected to coulomb force directed toward the electrode 11 along the lines of electric force 14. On the other hand, a particle 212 negatively charged is subjected to coulomb force directed toward the electrode 12 along the lines of electric force 14. A particle 213 not charged is subject to a gradient force, a type of an electrostatic force, occurring in the direction in which the lines of electric force 14 becomes dense, and attracted in the direction of the electrode 11.

When the regions 10a and 10b charged to different polarities are generated in this way, the plate member 117 can capture particles regardless of the charging state of the particles. Therefore, even if the mold 100 is charged by the separation operation, the plate member 117 can capture a particle moving with the movement of the stage 110 against the gas flow by the gas blow-off units 113 (also referred as a Couette flow). This enables reducing the adhesion of particles to the mold 100 and pinching of particles between the mold 100 and the substrate 101.

In addition, charging the regions 10a and 10b to different polarities enables making it difficult to form an electric field directed from the plate member 117 toward a counter member 15 existing at the position facing the plate member 117. The counter member 15 refers to a member which will face the plate member 117 during movement of the stage 110. The counter member 15 includes, for example, the supply unit 105, the chuck 106, the stage 107, the measurement units 112, and base 114.

Since an electric field directed toward the counter member 15 is unlikely to be formed, particles on the plate member 117 can reduce the adhesion of particles to the counter member 15 to a further extent than in a case where the regions 10a and 10b are charged to the same polarity. This provides effects of preventing or reducing at least one of pinching of particles between the mold 100 and the substrate 101 by the adhesion to the mold 100, a measurement error by the adhesion to the measurement units 112, and refloating of a particle which once adhered to the counter member 15.

It is desirable that the distance L between the electrodes 11 and 12 is determined based on the difference between the height of the standby position of the mold 100 in a time period other than the time of pattern formation operations (mold pressing operation and mold releasing operation) and the height of the plate member 117 at the imprint position.

For example, when applying a +1 kV voltage to the electrode 12 and applying a -1 kV voltage to the electrode 11, it is desirable that the distance L between the electrodes 11 and 12 is shorter than the difference between the height of the standby position of the mold 100 at other than the time of pattern formation operations and the height of the plate member 117 at the imprint position. At the position away, by the distance L, from the electrodes 11 and 12 in the +Z direction, since the potential is about 0V, it is possible to prevent the generation of an electric field directed from the plate member 117 toward the counter member 15 facing the plate member 117 (an electric field directed toward the +Z direction).

Example

Figure 4:
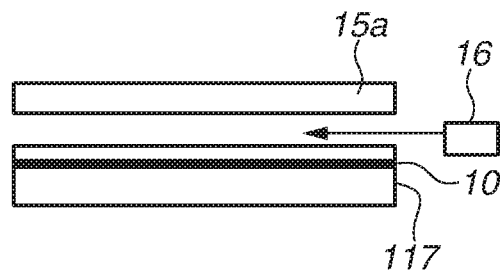
FIG. 4 illustrates an experimental system.

The difference in adhesion of particles to the counter member 15 due to the difference in voltage applied to the electrode group 10 will be described below. FIG. 4 illustrates a configuration of an experimental system. In a state where the plate member 117 and the counter member 15a were separated by a predetermined distance, a gas containing a predetermined number of particles was supplied to the space between the plate member 117 and the counter member 15a by the supply unit 16. At this time, voltages with different polarities (+1 kV and -1 kV) were applied to the electrodes 11 and 12. Further, as a comparative example, a voltage with the same polarity (+1 kV) was applied to the electrodes 11 and 12. Then, we detected particles adhering to the counter member 15a by using an inspection apparatus, and counted the number of particles.

Figure 5A:
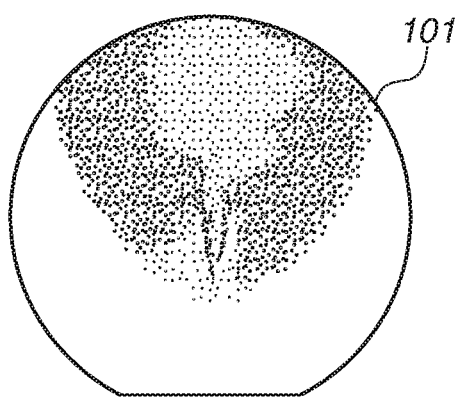
FIGS. 5A and 5B illustrate experimental results.
Figure 5B:
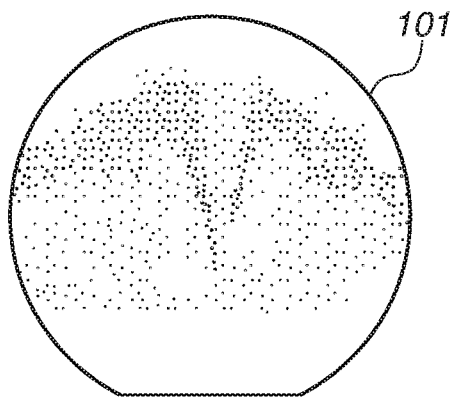

FIGS. 5A and 5B illustrate experimental results. FIG. 5A illustrates a result when voltages with different polarities were applied to the electrodes 11 and 12. FIG. 5B illustrates a result when a voltage with the same polarity (+1 kV) is applied to the electrodes 11 and 12. A black region in the counter member 15a indicates a portion where a particle adheres.

We confirmed that, as illustrated in FIGS. 5A and 5B, applying voltages with different polarities to the electrodes 11 and 12 enables restricting the amount of particles adhering to the counter member 15a to a further extent than applying a voltage with the same polarity thereto. When voltages with different polarities are applied to the electrodes 11 and 12, the number of particles adhering to the counter member 15a was one-fifth or less the number in the case of the comparative example.

(Imprinting Method)

FIG. 6 is a flowchart 210 illustrating an imprinting method by the imprint apparatus 1. In step S201, the voltage source 119 applies voltages to the electrode group 10 on the plate member 117. The electrodes 11 and 12 are charged to potentials with different polarities. In step S202, the control unit 121 controls a conveyance mechanism (not illustrated) to carry the mold 100 and the substrate 101 in the imprint apparatus 1. In step S203, the stage 110 moves the first region to be processed 122 to the supply position, and the supply unit 105 supplies the imprint material 102.

In step S204, the control unit 121 forms a pattern on the region to be processed 122. The process in step S204 includes an operation for bringing the imprint material 102 and the mold 100 into contact with each other, an operation for curing the imprint material 102 by the irradiation unit 103, and an operation for separating the imprint material 102 from the mold 100.

In step S205, the control unit 121 determines whether the region to be processed 122 subjected to the next pattern formation is present. When the control unit 121 determines that the region to be processed 122 subjected to the next pattern formation is present (YES in step S205), the processing repeats steps S203 to S205. On the other hand, when the control unit 121 determines that the region to be processed 122 subjected to the next pattern formation is not present (NO in step S205), the processing proceeds to step S206. In step S206, the control unit 121 carries out the mold 100 and the substrate 101 from the imprint apparatus 1. In step S207, the voltage source 119 stops the voltage application to the electrodes 11 and 12 to stop the charging state.

The imprint apparatus 1 may perform an operation for cleaning particles which may have adhered to the mold 100 for each predetermined number of substrates of a predetermined lot or for each predetermined number of substrates. The control unit 121 may perform a process for raising the plate member 117 in the +Z direction so as to reduce the relative distance between the plate member 117 and the mold 100 at the position where the plate member 117 and the mold 100 face each other. In this case, it is desirable that the potential of the mold 100 is measured and that a voltage having a larger absolute value than the measurement result is applied to the electrode group 10.

When the cleaning operation is performed, particles which have once adhered to the pattern surface 100a can be attracted toward the plate member 117 and then captured. At the time of pattern formation, therefore, the cleaning operation reduces pinching of particles between the mold 100 and the substrate 101 to enable reducing the occurrence of pattern defects and damages to the mold 100.

Figure 7A:
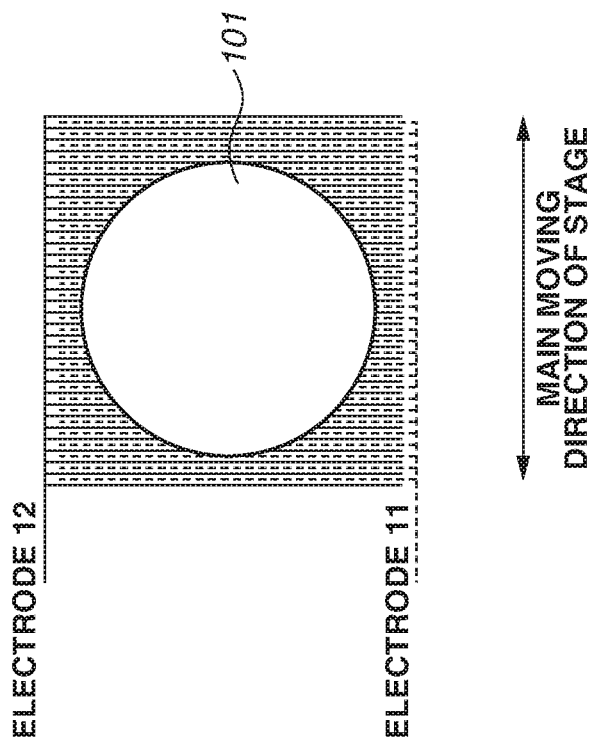
FIGS. 7A and 7B illustrate other configurations of an electrode group.
Figure 7B:
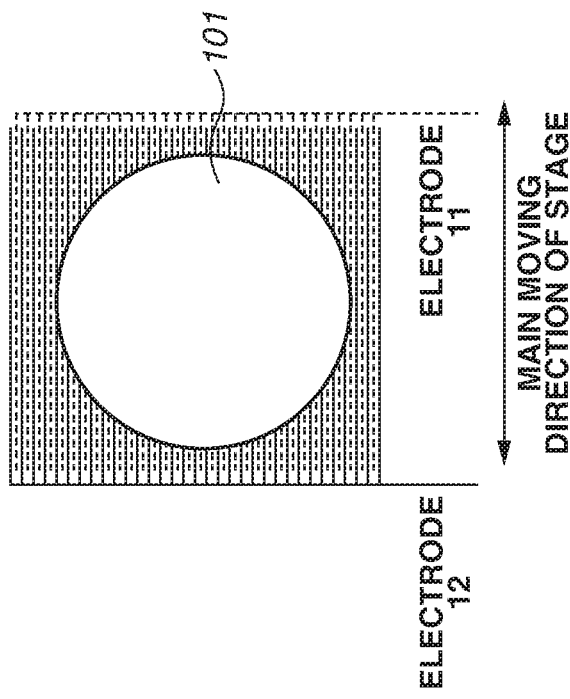

A second exemplary embodiment will be described below. FIGS. 7A and 7B illustrate a configuration of the electrode group 10 different from the configuration according to the first exemplary embodiment. The main arrangement directions of the electrodes 11 and 12 may extend in the direction along the main moving direction of the stage 110 (refer to FIG. 7A), or may extend in the direction along the direction perpendicularly intersecting with the main moving direction of the stage 110 (the direction intersecting with the main moving direction) (refer to FIG. 7B).

In either case, the plate member 117, while capturing particles, can reduce the adhesion of particles to the counter member 15 compared with a case where voltages with the same polarity are applied to the electrodes 11 and 12. In a more preferable case, the electrodes 11 and 12 extend in the direction along the main moving direction of the stage 110.

Figure 8:
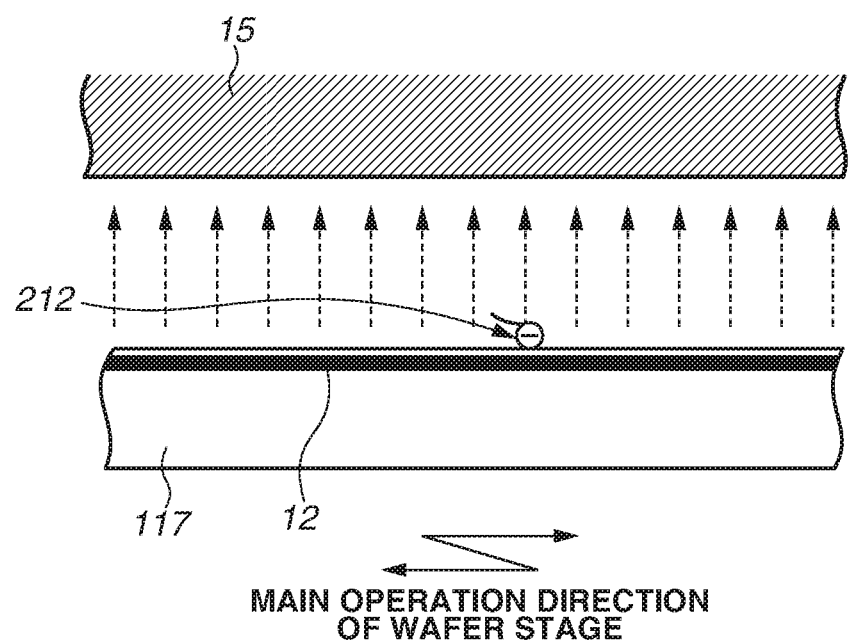
FIG. 8 is a first drawing illustrating a relation between the extension direction of an electrode and the behavior of a particle.

FIG. 8 is a first drawing illustrating a relation between the extension direction of the electrodes 11 and 12 and the behavior of the particle 212 floating along the moving direction of the stage 110. In particular, FIG. 8 illustrates the behavior of the particle 212 when the electrodes 11 and 12 extend in the direction along the main moving direction of the stage 110. Since the main moving direction of the stage 110 and the extension direction of the electrodes 11 and 12 are in parallel, the particle 212 moves between the member 15 and the plate member 117 being subjected to a fixed electric field.

For example, in the case of the electrode 12, the negatively charged particle 212 is likely to be constantly subjected to a unidirectional electrostatic force in the X-axis direction. Therefore, the particle 212 approaches the electrode 12 while drawing a parabola-shaped locus and is captured in a region in the vicinity of the electrode 12. Similarly, the particle 212 positively charged by the electrode 11 is captured.

Figure 9:
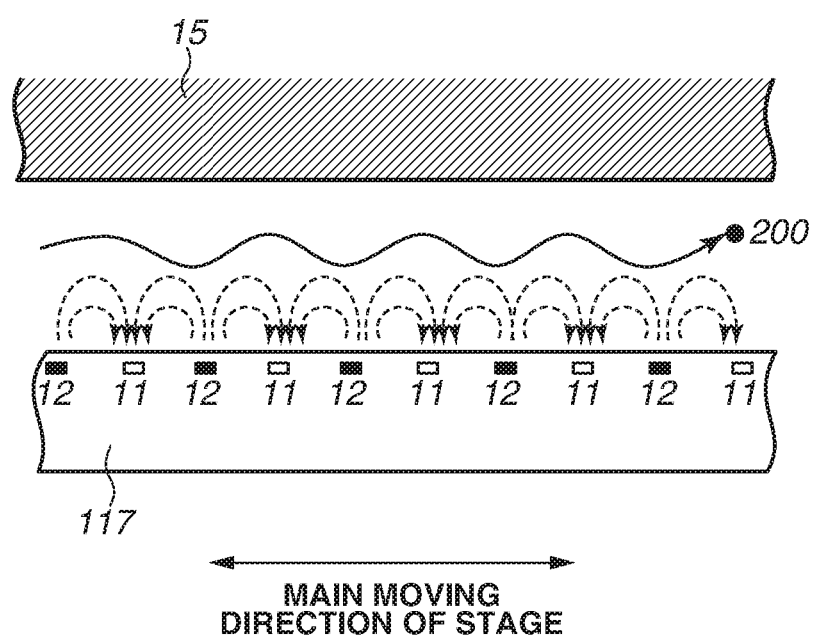
FIG. 9 is a second drawing illustrating a relation between the extension direction of electrodes and the behavior of a particle.

FIG. 9 is a second drawing illustrating a relation between the extension direction of the electrodes 11 and 12 and the behavior of the particle 212 floating along the moving direction of the stage 110. More specifically, FIG. 9 illustrates the behavior of the particle 212 when the main extension direction of the electrodes 11 and 12 extends in the direction perpendicularly intersecting with the main moving direction of the stage 110. As illustrated in FIG. 9, a particle 200 moves between the member 15 and the plate members 117 being subjected to electric fields directed toward alternately different directions. Therefore, the particle 200 moving along the moving direction of the stage 110 may be unlikely to be captured by the plate member 117 compared with a case where the electrodes 11 and 12 extend in the main moving direction of the stage 110.

Figure 10:
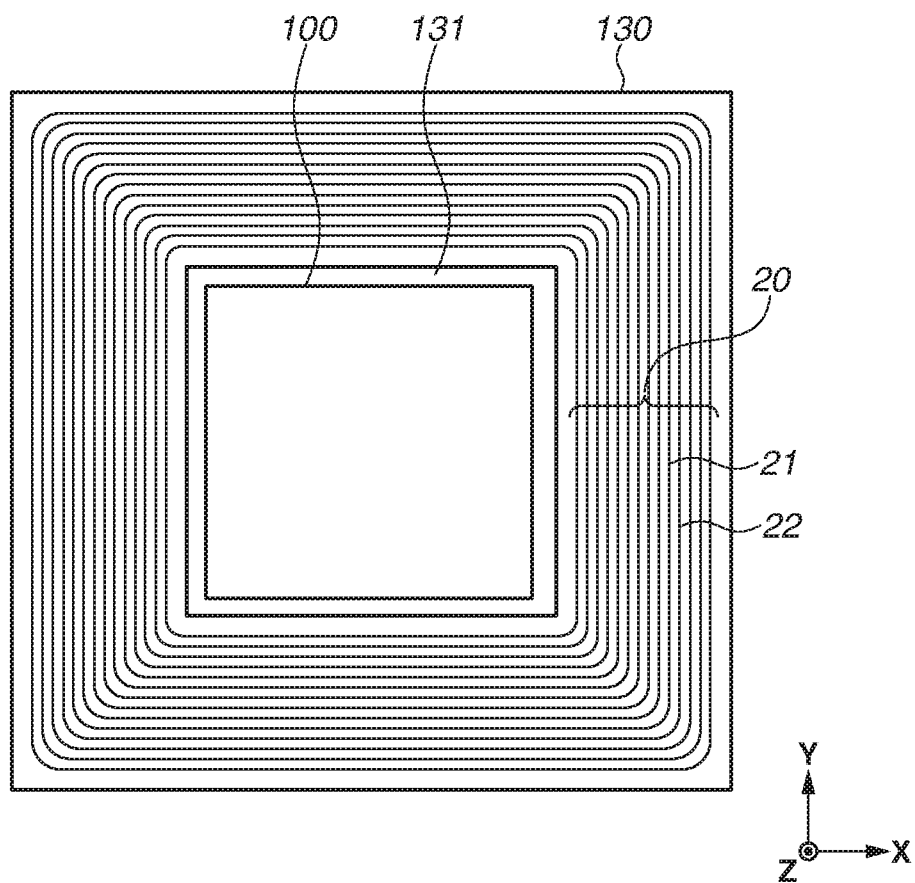
FIG. 10 illustrates a configuration of a plate member provided around the disposed position of a mold.

A third exemplary embodiment will be described below. The plate member 117 for capturing particles needs to be at least either one of (1) and (2): (1) a member disposed so as to surround the outer circumference of the region of the mold holding unit covered by the mold 100 in the direction along the surface of the mold 100, and (2) a member disposed so as to surround the outer circumference of the region of the substrate holding unit covered by the substrate 101 in the direction along the surface of the substrate 101. FIG. 10 illustrates a configuration of a plate member 130 disposed on the mold holding unit. On the plate member 130, an electrode group 20 including alternately arranged electrodes 21 and 22 is disposed.

When the electrodes 21 and 22 are charged to different polarities, a region in the vicinity of the electrode 21 and a region in the vicinity of the electrode 22 are charged to different polarities. Thus, the plate member 130, while capturing particles, can reduce the adhesion of particles to the member facing the plate member 130. More specifically, the plate member 130 can restrain the adhesion of particles to the substrate 101.

It is desirable that the electrodes 21 and 22 are such members that surround the outer circumference of the region covered by the mold 100 in the direction along the surface of the mold 100 (in the direction along the holding surface for holding the mold 100), but the electrodes 21 and 22 are not limited to such members.

Figure 11:
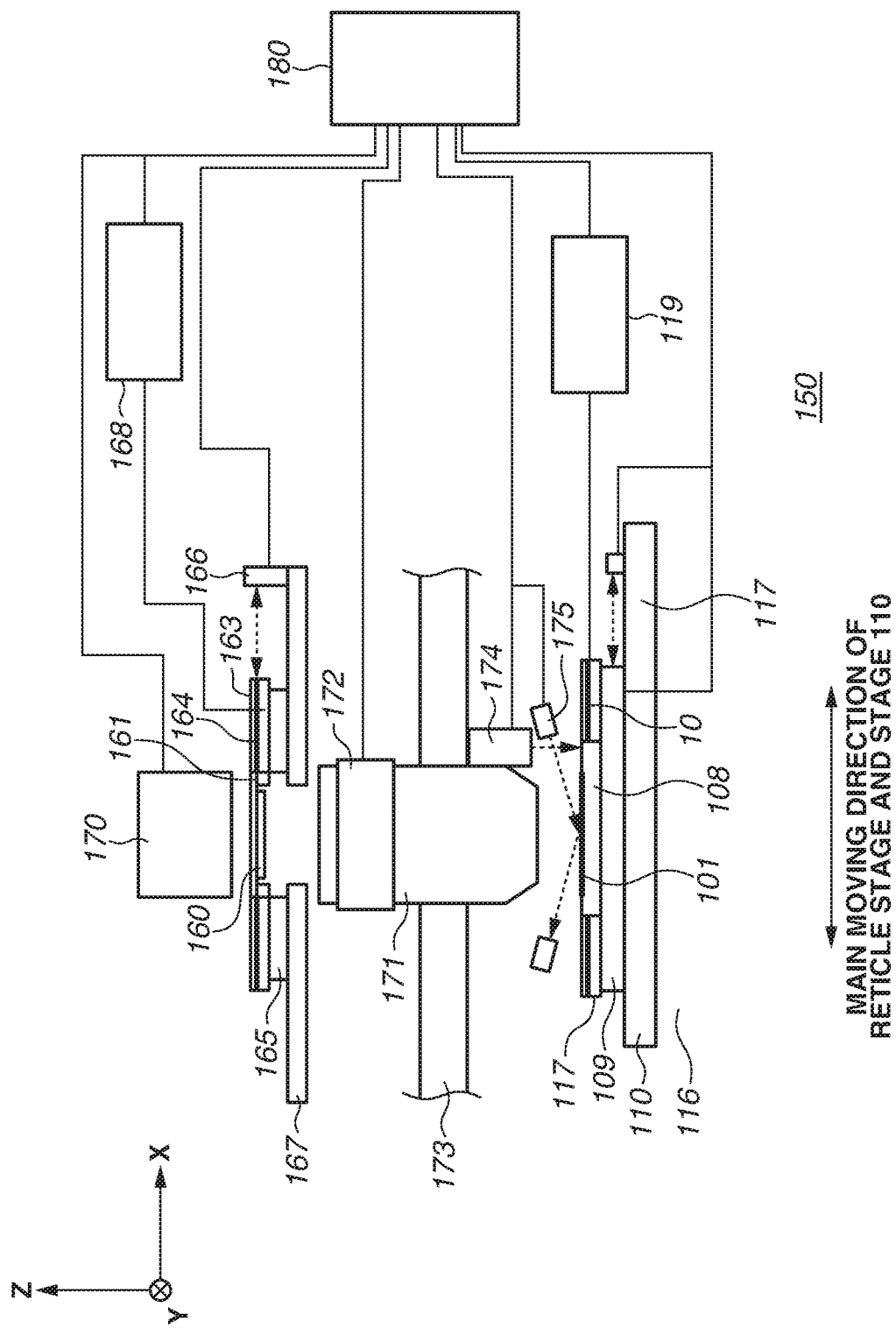
FIG. 11 illustrates a configuration of an exposure apparatus.

A fourth exemplary embodiment will be described below. The stage 110 may be mounted on other lithography apparatuses. For example, the stage 110 may be mounted on an exposure apparatus, as a lithography apparatus, for forming a latent image pattern by a resist on the substrate 101 through irradiation of light such as i rays, KrF laser light, and extreme ultraviolet (EUV) light. FIG. 11 illustrates a configuration of an exposure apparatus 150 mounting the stage 110. Referring to FIG. 11, component members identical to those of the imprint apparatus 1 are assigned the same reference numerals.

A reticle (object or original plate) 160 is provided with a circuit pattern formed thereon and a transparent protective film (pellicle film) for preventing adhesion of particles. The exposure apparatus 150 has a chuck 161 and a reticle stage 165 as a holding unit for holding the reticle 160. The chuck 161 holds the reticle 160 through an electrostatic force, a vacuum suction force, or a mechanical holding unit.

A plate member 163 is disposed at the peripheral portion of the portion for holding the reticle 160. An electrode group 164 is disposed on the plate member 163. The reticle stage 165 performs a scanning operation in the X-axis direction together with the reticle 160 and the chuck 161. The interferometer 118 measures the position of the reticle stage 165. A structure 167 supports the reticle stage 165.

An illumination system 170 illuminates the pattern of the reticle 160. A projection system (optical system) 171 performs reduction projection of the pattern of the reticle 160 illuminated by the illumination system 170 onto the substrate 101. A correction unit 172 corrects the magnification and distortion of a projection image in the projection system 171. A structure 173 supports the projection system 171. A scope 174 measures the position of the substrate 101. A measurement system 175 measures the height and inclination of the substrate 101.

A control unit 180 is connected with the illumination system 170, the interferometer 118, the voltage sources 119 and 168, the correction unit 172, the scope 174, and the measurement system 175 to control these component members. While the stage 110 is moving the substrate 101 in the X-axis direction for scanning, the exposure apparatus 150 moves the reticle 160 in the X-axis direction for scanning in synchronization with the drive of the substrate 101.

The electrode group 164 has a plurality of electrodes. The control unit 180 controls the voltage source 168 to apply voltages to the electrode group 164 to charge the first and the second electrodes of the electrode group 164 to different polarities. More specifically, the control unit 180 forms two different regions charged to different polarities around the reticle 160. The control unit 180 also forms two different regions charged to different polarities on the plate member 163.

This enables reducing the adhesion of particles to the counter member compared with a case where the regions on the plate member 117 are charged only to the same polarity. The counter member for the plate member 117 includes, for example, the structure 173, the projection system 171, and the scope 174. This further enables reducing the adhesion of particles to the counter member compared with a case where the regions on the plate member 163 are charged only to the same polarity. The counter member for the plate member 163 is, for example, the illumination system 170.

It is possible to restrain defects of a pattern to be formed, derived from the adhesion of particles to the illumination system 170 or the final lens of the projection system 171. Since particles can be captured, the adhesion of particles to the reticle 160 or the substrate 101 can be restrained.

[Main Moving Direction of Stage]

Figure 12:
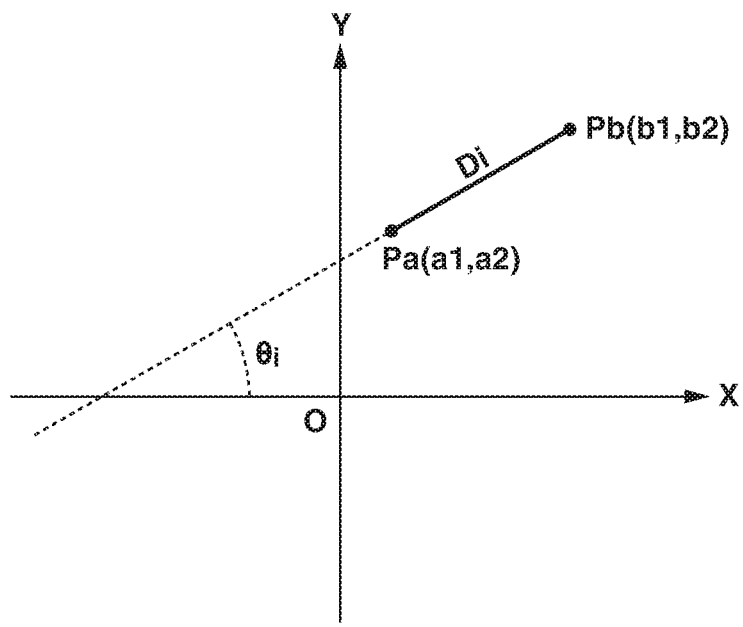
FIG. 12 is a first drawing illustrating the main moving direction of a stage.

The stage 110 moves in various directions during each operation. It is desirable to determine the main moving direction of the stage 110 in consideration of the moving direction and distance of the stage 110. An example of the main moving direction of the stage 110 will be described below with reference to FIGS. 12 and 13. FIG. 12 illustrates a definition of the main moving direction at the time of calculation. Assuming the center of the mold 100 as an origin O, the control unit 180 divides various movements of the stage 110 into movements between two points. Assume that, in a certain operation, the stage 110 moves from a position Pb (b1, b2) to a position Pa (a1, a1) by a moving distance Di, forming an angle θi with respect to the X axis.

Figure 13:
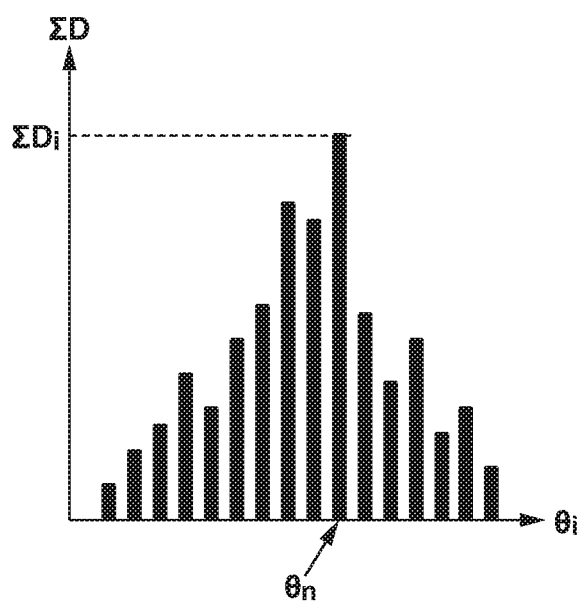
FIG. 13 is a second drawing illustrating the main moving direction of the stage.

The control unit 180 calculates the distance Di and the angle θi for each operation of the stage 110, and generates a function of the sum ΣDi of the distances Di for the same angle θi. FIG. 13 illustrates a relation between the angle θi and the sum ΣDi. The main moving direction of the stage 110 refers to the direction of a predetermined angle θn at which the sum ΣDi is maximized. When arranging the electrode group 10, it is preferable to arrange the electrodes 11 and 12 so as to extend in the direction calculated in this way. In the imprint apparatus 1, the angle θn refers to the direction directed from the above-described supply unit 105 toward the imprint position (X-axis direction).

Also in the exposure apparatus 150, the main moving direction of the stage 110 is determined by a similar calculation method to the case of the imprint apparatus 1. In the case of the exposure apparatus 150, the moving direction and moving distance of the movement accompanying the measurement operation by the measurement system 175 and the scope 174 are also taken into consideration. In the case of the exposure apparatus 150, the X-axis direction is the main moving direction of the reticle stage 165 and also is the main moving direction of the stage 110. Therefore, it is more desirable that the extension direction of the electrodes of the electrode group 164 is in parallel with the direction of the reticle stage 165. It is desirable that the extension direction of the electrodes of the electrode group 10 is the direction along the main moving direction of the stage 110.

In addition, in a series of stage operations in each apparatus, the accumulative moving distance in the X-axis direction is compared with the accumulative moving distance in the Y-axis direction, and the direction of the axis having a larger accumulative moving distance may be considered as the main operation direction. Since the stage speed also affects the behavior of a particle, the main moving direction of the stage may be determined by using an evaluation function which combines the stage speed and the stage moving direction.

Other Exemplary Embodiments

Each of the mold holding unit, the substrate holding unit, and the holding unit for holding the reticle 160 may hold only the outer circumference of the corresponding holding target (object). In such a case, the peripheral region of the region covered by the holding target object means a region outside the holding target of each of the mold holding unit, the substrate holding unit, and the holding unit for holding the reticle 160.

The configuration of the electrode group 10 is not limited to those according to the above-described exemplary embodiments. The electrodes 11 and 12 may be alternately arranged on a coaxial basis with respect to the disposed position of the substrate 101. Alternatively, rectangular electrodes 11 and 12 are alternately arranged so as to surround the portion for holding the substrate 101. The electrode group 10 may be wired to enable controlling the presence or absence of the voltage application for each of the electrodes 11 and 12. By not applying a voltage to each predetermined number of electrodes, the control unit 180 may adjust the interval between the charged electrodes 11 and the interval between the charged electrodes 12. The magnitude of the application voltage may be changed according to the degree of charging of the mold 100.

A constantly charged material such as electret resin may be arranged instead of using the electrode group 10 and the voltage source 119. In this case, it is desirable to arrange at least two different charging materials charged to different polarities.

According to the present specification, a "particle" refers to a material not intended to be involved in pattern formation. Particles include, for example, the imprint material 102 discharged by the supply unit 105, that has floated as mist and become a dry solid material, microparticles arising from component members of the imprint apparatus 1, and dust entered the imprint apparatus 1 from the outside space and existing therein.

A curable composition (sometimes also referred to as an uncured resin) which is cured when energy for curing is applied is used as the imprint material 102 to be used by the imprint apparatuses 1 and the resist to be used by the exposure apparatus 150. Electromagnetic waves and heat are used as energy for curing. Electromagnetic waves include, for example, light such as infrared rays, visible light, and UV-rays selected from a wavelength range from 10 nm or above to 1 mm or below.

A curable composition is a composition cured by irradiation of light or a composition cured by heating. A photo-curable composition cured by light may contain at least a polymerizable composition and a photo-polymerizable initiator, and may contain a non-polymerizable composition or a solvent as required. A non-polymerizable composition is at least one type selected from groups including sensitizers, hydrogen donors, internal mold release agents, interfacial active agents, antioxidants, and polymer components.

The imprint material 102 is applied onto the substrate 101 in the form of a film by a spin coater or a slit coater. Alternatively, the imprint material 102 may be applied onto the substrate 101 in the form of droplets, in the form of an island formed by a series of a plurality of droplets, or in the form of a film, by a liquid jet head. The viscosity (at 25 degrees) of the imprint material 102 is, for example, 1 mPa·s or above and 100 mPa·s or below.

[Article Manufacturing Method]

A cured material pattern formed on the substrate 101 by the lithography apparatus 1 according to the above-described exemplary embodiments is permanently used for at least a part of various types of articles or temporarily used when manufacturing various types of articles.

The substrate 101 may be made of a glass, a ceramic, a metal, a semiconductor, a resin, etc. If necessary, a member made of a material different from the substrate 101 may be formed on the surface of the substrate 101. Specifically, the substrate 101 is made of, for example, a silicon wafer, a compound semiconductor wafer, or a silica glass.

Articles include, for example, electric circuit elements, optical elements, micro electro mechanical systems (MEMS), recording elements, sensors, and molds. Electric circuit elements include volatile or nonvolatile semiconductor memory such as a dynamic random access memory (DRAM), a static random access memory (SRAM), a flash memory, or a magnetoresistive random access memory (MRAM), and include semiconductor devices such as a large-scale integration (LSI), a charge-coupled device (CCD), an image sensor, and a field-programmable gate array (FPGA). Molds include a mold for imprinting (a mold on which a pattern is reproduced).

A cured material pattern is used as it is at least as a part of component members of the above-described articles or is temporarily used as a resist mask. The resist mask is removed after etching or ion implantation is performed in a substrate working process. The substrate working process may further include other known processing steps (development, oxidization, film formation, vapor deposition, flattening, resist separation, dicing, bonding, and packaging).

While aspects of the present invention have been described with reference to exemplary embodiments, it is to be understood that the aspects of the invention are not limited to the disclosed exemplary embodiments. The scope of the following claims is to be accorded the broadest interpretation so as to encompass all such modifications and equivalent structures and functions.

This application claims the benefit of Japanese Patent Application No. 2016-038129, filed Feb. 29, 2016, which is hereby incorporated by reference herein in its entirety.

What is claimed is:

1. An imprint apparatus for forming a pattern of an imprint material on a substrate by using a mold, the imprint apparatus comprising:
    a voltage source;
    a mold holding unit configured to hold the mold;
    a substrate holding unit configured to hold the substrate; and
    a plate member provided on at least either one surface of a peripheral region of a region covered by the mold of the mold holding unit and a peripheral region of a region covered by the substrate of the substrate holding unit,
    wherein a first electrode and a second electrode are provided on a surface of the plate member,
    wherein each of the first electrode and the second electrode is applied with electric potential having different polarity with each other so that an electric field is formed between the first electrode and the second electrode, and
    wherein the voltage source applies a positive potential with respect to the ground potential to the first electrode, and applies a negative potential with respect to the ground to the second electrode.

2. The imprint apparatus according to claim 1,
    wherein the substrate holding unit is movable while holding the substrate, and
    wherein the first and the second electrodes extend in a direction along a moving direction of the substrate holding unit.

3. The imprint apparatus according to claim 2, wherein the moving direction is a direction directed from a position facing a supply unit for supplying the imprint material onto the substrate toward a position facing the mold.

4. The imprint apparatus according to claim 1, wherein the first and the second electrodes are disposed so as to surround an outer circumference of the region covered by the substrate in a direction along a surface of the substrate.

5. The imprint apparatus according to claim 1, wherein the first and the second electrodes are disposed so as to surround an outer circumference of the region covered by the mold in a direction along a surface of the mold.

6. The imprint apparatus according to claim 1,
    wherein the plate member is provided on the peripheral region of the region covered by the substrate of the substrate holding unit, and has a function of guiding to a space between the mold and the substrate a gas supplied from a gas supply unit to the peripheral region.

7. The imprint apparatus according to claim 1, wherein the first and the second electrodes face a space on a side where the mold of the mold holding unit is held and on a side where the substrate of the substrate holding unit is held in a state where the mold and the substrate face each other.

8. The imprint apparatus according to claim 1,
    wherein a plurality of portions of the first electrode and a plurality of portions of the second electrode are provided on the plate member so as to be alternately arranged.

9. A method for manufacturing an article, the method comprising:

forming, by using an imprint apparatus for forming a pattern of an imprint material on a substrate by using a mold, a pattern of a cured imprint material on the substrate; and processing the substrate with a pattern formed thereon in the forming to manufacture the article, wherein the imprint apparatus includes:

a mold holding unit configured to hold the mold; and a substrate holding unit configured to hold the substrate, and wherein a particle is captured by providing a first electrode and a second electrode in at least either one of a peripheral region of a region covered by the mold of the mold holding unit and a peripheral region of a region covered by the substrate of the substrate holding unit, applying each of the first electrode and the second electrode with electric potential having different polarity with each other so that an electric field is formed between the first electrode and the second electrode, and applying a positive potential with respect to the ground potential to the first electrode, and to applying a negative potential with respect to the ground to the second electrode.

10. An exposure apparatus comprising:

an optical system configured to project onto a substrate a pattern formed on an original plate; and a holding apparatus configured to hold the original plate or the substrate, wherein the holding apparatus includes a holding unit configured to hold the original plate or the substrate, and wherein a particle is captured by providing a first electrode and a second electrode in a peripheral region of a region covered by the original plate held by the holding unit, applying each of the first electrode and the second electrode with electric potential having different polarity with each other so that an electric field is formed between the first electrode and the second electrode, and applying a positive potential with respect to the ground potential to the first electrode, and applying a negative potential with respect to the ground to the second electrode.

11. A method for manufacturing an article, the method comprising:

forming a pattern on the substrate by using the exposure apparatus according to claim 10; and processing the substrate with a pattern formed thereon in the forming to manufacture the article.

* * * * *